United States Patent
Petre et al.

(10) Patent No.: US 7,965,216 B1
(45) Date of Patent: Jun. 21, 2011

(54) COMPRESSED SENSING ANALOG-TO-DIGITAL CONVERTER

(75) Inventors: Peter Petre, Oak Park, CA (US); Jose Cruz-Albrecht, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 67 days.

(21) Appl. No.: 12/262,691

(22) Filed: Oct. 31, 2008

Related U.S. Application Data

(60) Provisional application No. 60/984,357, filed on Oct. 31, 2007.

(51) Int. Cl.
*H03M 1/12* (2006.01)
(52) U.S. Cl. .................... 341/155; 341/143
(58) Field of Classification Search .......... 341/155, 341/143, 120
See application file for complete search history.

(56) References Cited

U.S. PATENT DOCUMENTS

| | | | |
|---|---|---|---|
| 4,383,248 A | 5/1983 | Smith | 340/999.999 |
| 4,939,515 A | 7/1990 | Adelson | 341/51 |
| 5,185,715 A | 2/1993 | Zikan | 364/807 |
| 5,345,398 A | 9/1994 | Lippmann et al. | 702/53 |
| 5,479,170 A | 12/1995 | Cauwenberghs et al. | 341/200 |
| 5,566,099 A | 10/1996 | Shimada | 364/717 |
| 5,894,280 A | 4/1999 | Ginetti et al. | 341/118 |
| 6,172,536 B1 | 1/2001 | Yoshihara | 327/87 |
| 6,452,524 B1 | 9/2002 | Fraleigh et al. | 341/143 |
| 6,473,019 B1 | 10/2002 | Ruha et al. | 341/143 |
| 6,975,682 B2 | 12/2005 | Cosand | 375/247 |
| 7,038,608 B1 | 5/2006 | Gilbert | 341/144 |
| 7,253,761 B1 * | 8/2007 | Hoyos et al. | 341/155 |
| 7,324,035 B2 * | 1/2008 | Harris et al. | 341/155 |
| 7,403,144 B1 | 7/2008 | Cruz-Albrecht | 341/143 |
| 7,405,686 B2 | 7/2008 | Laroia et al. | 341/143 |
| 7,573,956 B2 * | 8/2009 | Lazar et al. | 375/340 |
| 2006/0087467 A1 * | 4/2006 | Itskovich | 341/155 |
| 2007/0069928 A1 | 3/2007 | Gehring | 445/115.1 |

OTHER PUBLICATIONS

U.S. Appl. No. 11/726,484, filed Mar. 22, 2007, Cruz-Albrecht, Jose, et al.
U.S. Appl. No. 60/984,354, filed Oct. 31, 2007, Cruz-Albrecht, Jose.
U.S. Appl. No. 60/984,357, filed Oct. 31, 2007, Petre, Peter.
Cruz, J.M., et al, "A 16 x 16 Cellular Neural Network Universal Chip: The First Complete Single-Chip Dynamic Computer Array with Distributed Memory and with Gray Scale Input-Output," Analog Integrated Circuits and Signal Processing, 15, pp. 227-237, 1998.

(Continued)

*Primary Examiner* — Peguy JeanPierre
(74) *Attorney, Agent, or Firm* — Ladas & Parry

(57) ABSTRACT

A system for analog-to-digital signal conversion featuring compressed sensing analog-to-digital converter systems. An analog signal is connected to a time encoder having a pulse frequency. The analog signal frequency is higher than the pulse frequency. The time encoder is configured to generate an excitation vector including a plurality of projection values of the analog signal into a plurality of testing basis functions, and a plurality of known basis functions. The output of the time encoder is connected to an input of a pulse domain demultiplexer, and the pulse domain demultiplexer is connected to the pulse-to-asynchronous digital converter in a predetermined sequence. The pulse-to-asynchronous digital converter is connected to the asynchronous-digital-to-synchronous digital converter in a predetermined sequence. The asynchronous-digital-to-synchronous digital converter is connected a digital signal processor configured to output an estimate of the analog signal. Methods to make the foregoing structure are also described.

18 Claims, 11 Drawing Sheets

OTHER PUBLICATIONS

Dighe, A.M., et al., "An Asynchronous Serial Flash Converter," 9$^{th}$ Int. Conf. on Electronics, Circuits and Systems, IEEE, pp. 13-15, 2002.

D. Donoho, "Compressed Sensing," IEEE Transactions on Information Theory, vol. 42, No. 4, pp. 1289-1306, Apr. 2006.

Iwamoto, M., et al., "Bandpass Delta-Sigma Class-S Amplifier," Electronic Letters, vol. 36, No. 12, pp. 1010-1012, Jun. 2000.

J. Keane and L. Atlas, "Impulses and Stochastic Arithmetic for Signal Processing," Proc. 2001 IEEE International Conference on Acoustics, Speech, and Signal Processing, pp. 1257-1260, 2001.

Lazar, A., et al., "Perfect Recovery and Sensitive Analysis of Time Encoded Bandlimited Signals," IEEE Transactions on Circuits and Systems-1 Regular Papers, vol. 51, No. 10, Oct. 2004.

Roza, E., "Analog to Digital Conversion via Duty Cycle Modulation," IEEE Trans. On Circuits and Systems-II, vol. 44, No. 11, pp. 907-914, Nov. 1997.

Walden, R., "Analog to Digital Converter Survey and Analysis," IEEE Journal on Selected Areas in Communication, vol. 17, No. 4, pp. 539-550, Apr. 1999.

Y. Xia and J. Wang, "A Recurrent Neural Network for Solving Non-linear Convex Programs Subject to Linear Constraints," IEEE Trans. On Neural Networks, vol. 16, No. 2, Mar. 2005.

Hasler et al ("VLSI Neural Systems and Circuits" 1990 IEEE), pp. 31-37.

Wang et al ("Review of pulse-coupled neural networks" 2009), pp. 5-13.

Laurent Perrinet ("Emergence of filters from natural scenes in a sparse spike coding scheme" 2004), pp. 821-826.

Author: Wikipedia; Title: "Van der Pol oscillator"; URL: http://en.wikipedia.org/wiki/Van_der_Pol_osciliator.

Author: Wikipedia; Title: "Relaxation oscillator"; URL: http://en.wikipedia.org/wiki/Relaxation_oscillator.

* cited by examiner

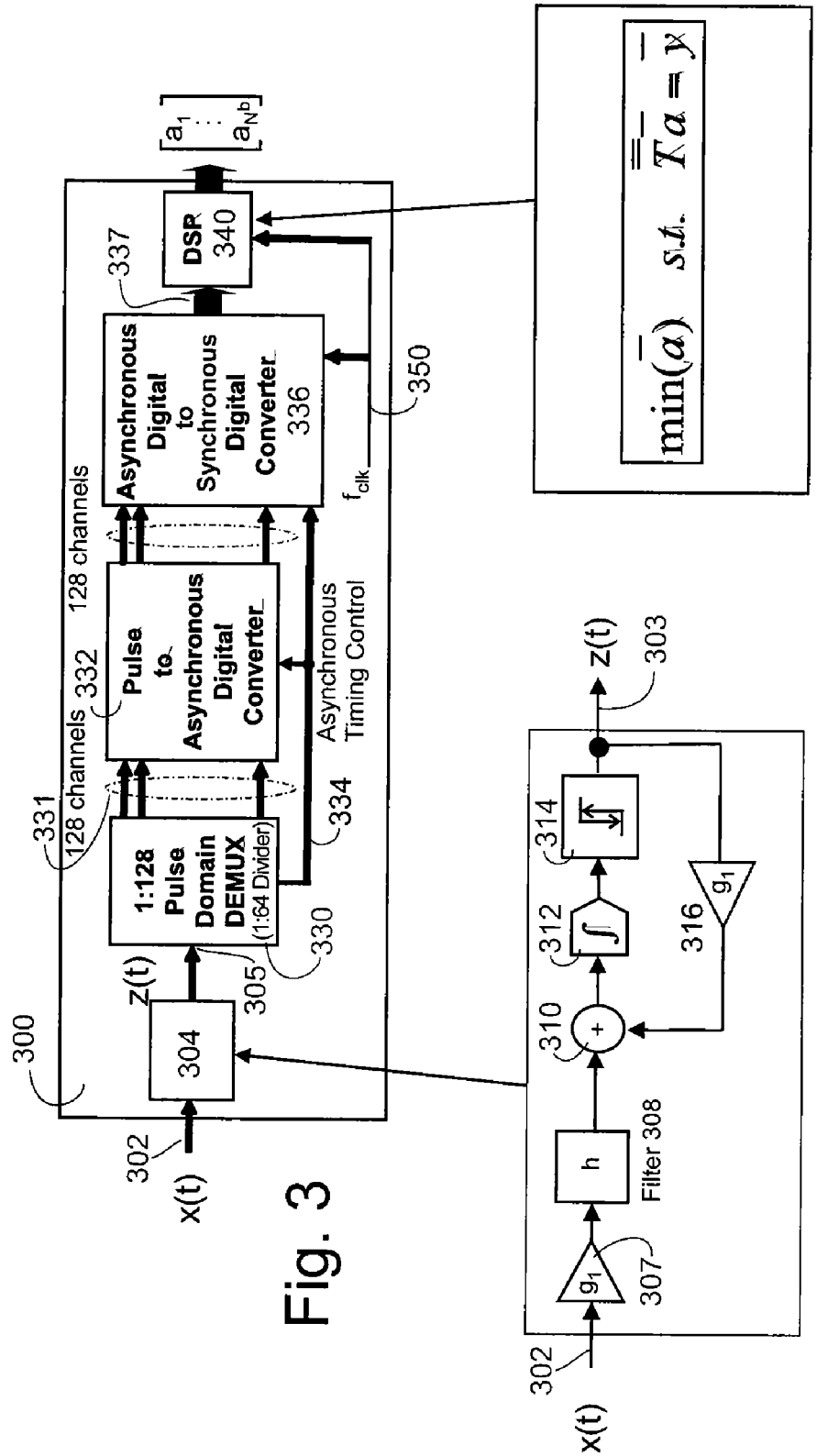

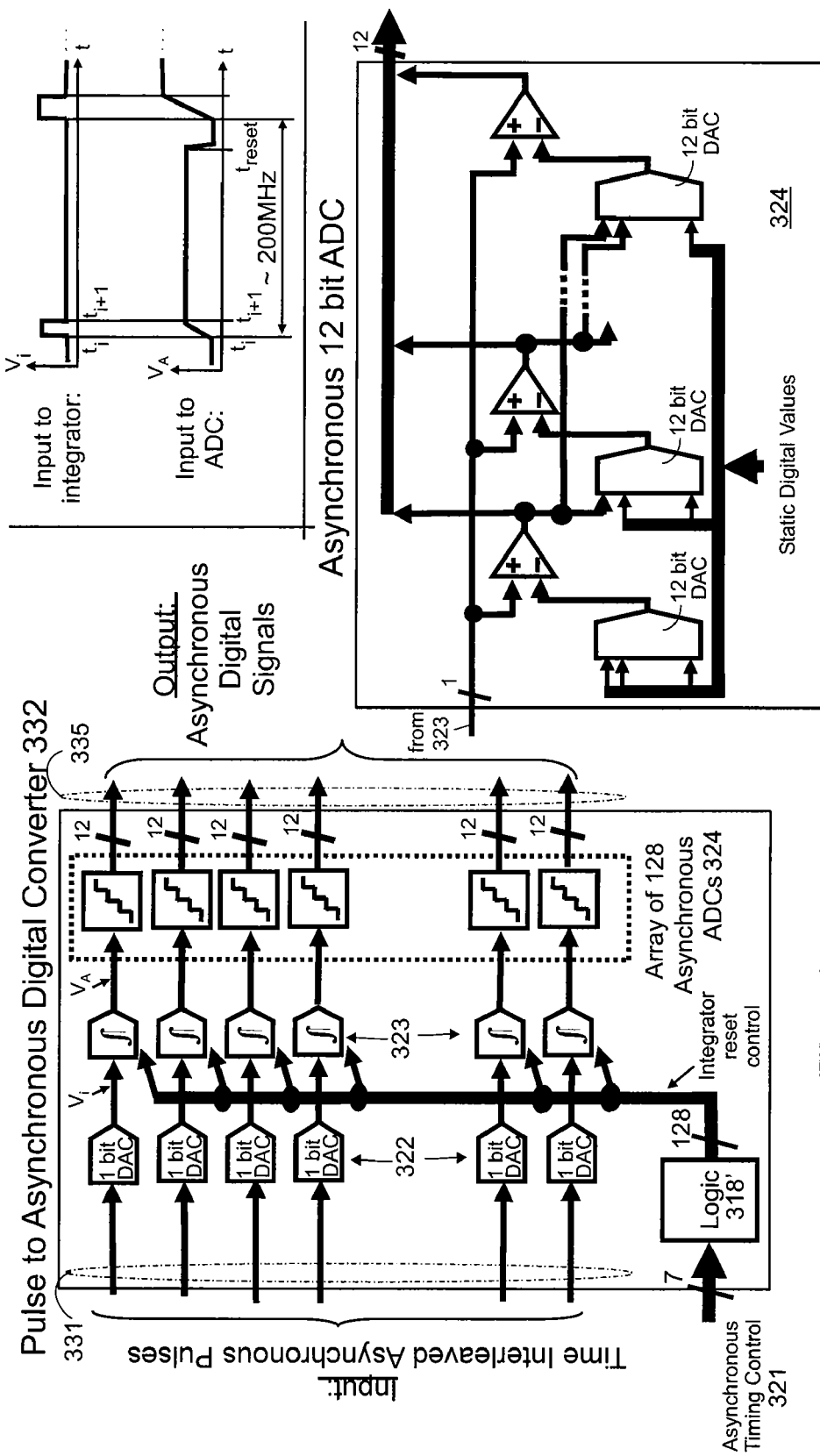

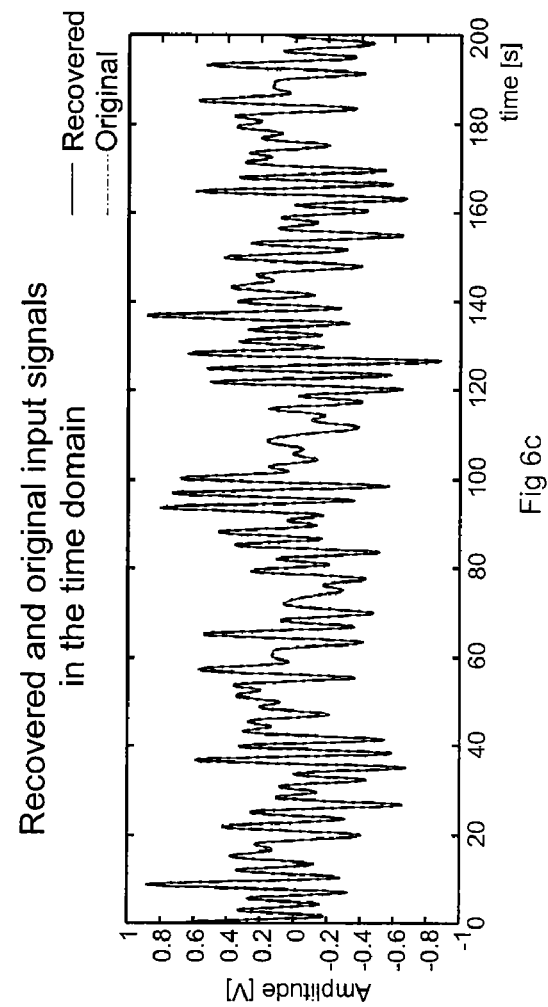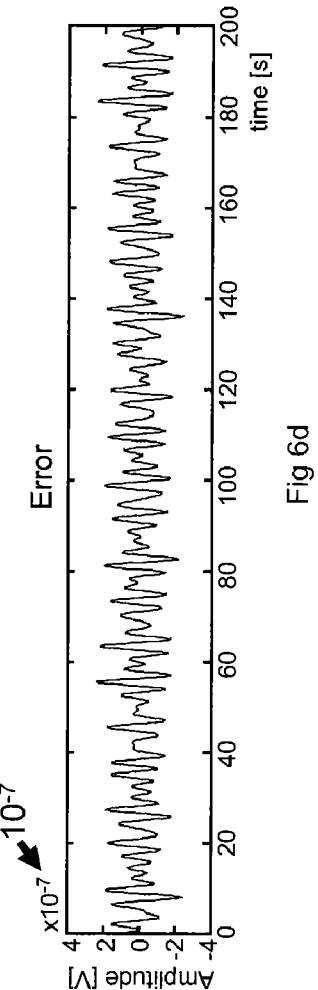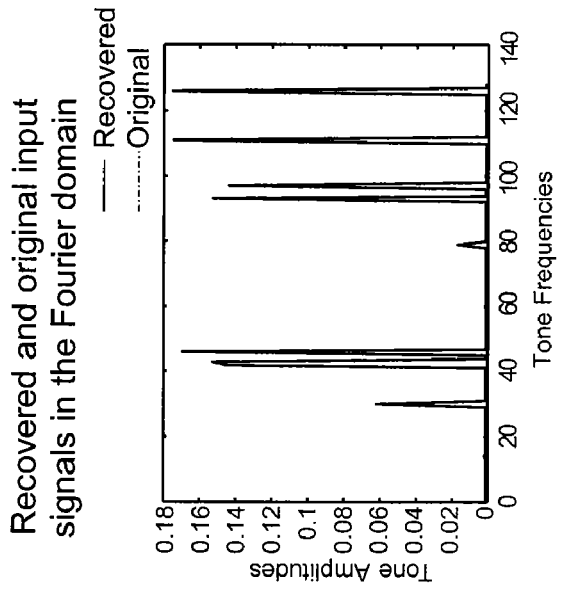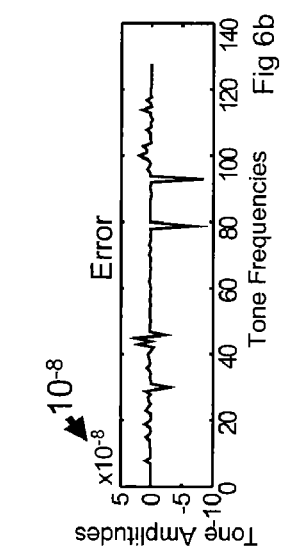

COMPRESSED SENSING ANALOG-TO-DIGITAL CONVERTER

CROSS-REFERENCE TO RELATED APPLICATIONS

This application is related to and claims the benefit of U.S. Provisional Patent Application Ser. No. 60/984,357 filed Oct. 31, 2007, the disclosure of which is hereby incorporated herein by this reference.

STATEMENT REGARDING FEDERALLY SPONSORED RESEARCH OR DEVELOPMENT

This invention was funded by the government under contract number DARPA/MTO BAA 05-35 "Analog to Information," N00173-06-C-4151 from DARPA, Washington, D.C.

INCORPORATION BY REFERENCE

References cited within this application, including patents, published patent applications other publications, such as listed below:
[1] A. Lazar and L Toth, "Perfect Recovery and Sensitivity Analysis of Time Encoded Bandlimited Signals," IEEE Trans. on Circuits and Systems—I, vol. 51, no. 10, pp. 2060-2073, October 2004;
[2] J. Cruz-Albrecht and P. Petre, "Asynchronous Pulse Processor Based Analog-to-Digital Converter," U.S. application Ser. No. 11/726,484, filed on Mar. 22, 2007;
[3] D. Donoho, "Compressed Sensing," IEEE Transactions on Information Theory, vol. 42, no. 4, pp. 1289-1306, April 2006;
[4] U.S. Provisional Patent Application Ser. No. 60/984,357 filed Oct. 31, 2007; and
[5] U.S. Pat. No. 7,403,144, which is assigned to the assignee of the present application,
are hereby incorporated by reference in their entirety.

THE NAMES OF THE PARTIES TO A JOINT RESEARCH AGREEMENT

Not applicable.

BACKGROUND

This disclosure is generally related to analog-to-digital signal conversion techniques and in particular to compressed sensing analog-to-digital converter systems and methods.

DESCRIPTION OF RELATED ART

Typically, an analog input signal can be converted into an asynchronous pulse sequence, and that the original analog input can be recovered from the pulse sequence. However, such transformation from analog domain into the pulse domain and back falls short of building an analog-to-digital converter. This is illustrated by FIG. 1 showing a block diagram of a time encoder. This time encoder has an analog input u(t) and a pulse output z(t). This time encoder encodes analog input into a pulse output. When the analog input is bandlimited having a maximum frequency below the pulse rate, the analog input can be recovered from the asynchronous pulse output.

FIG. 1 shows a diagram of a time encoder disclosed by Toth (see document [1] identified above). This time encoder circuit has a single analog input and a single pulse output. This circuit encodes analog input signals into a pulse signals. Assuming ideal elements, when the analog signal is bandlimited with a maximum frequency below the pulse rate, the analog input u(t) can be recovered from the asynchronous pulse output z(t).

This is illustrated by FIG. 2 showing an Analog-To-Digital Converter (ADC) based on time encoder of FIG. 1, a decoder to demultiplex the data, and a digital signal processor (DSP) to accomplish the recovery. The ADC of FIG. 2 is disclosed in our earlier patent application noted above as document [2]. The DSP recovers an analog input by performing a digital equivalent of low pass filtering the pulses of the time encoder or by implementing the recovery algorithm of Lazar and Toth presented in prior art reference [1]. The ADC of FIG. 2 attempts to encode and recover data when the analog input is bandlimited and the maximum frequency of the analog input is less than an average pulse frequency $f_p$. This prior art ADC will fail to recover the analog input if the analog input has frequency components above the average pulse frequency $f_p$.

BRIEF SUMMARY

Embodiments of the present disclosure provide a system and method for an analog-to-digital converter. Briefly described, in architecture, one embodiment of the system, among others, can be implemented as follows. An analog signal having a frequency is applied to an input of a time encoder. The time encoder has an input, an output, and operates at a pulse frequency with the analog signal frequency being higher than the pulse frequency. The time encoder is configured to generate an excitation vector including a plurality of projection values of the analog signal into a plurality of testing basis functions, and a plurality of known basis functions. The analog signal is connected to the input of the time encoder, the output of the time encoder is connected to an input of a pulse domain demultiplexer, and the pulse domain demultiplexer also has a plurality of outputs channels. The apparatus further includes a pulse-to-asynchronous digital converter having at least a plurality of inputs and a plurality of outputs, the plurality of outputs of the pulse domain demultiplexer are connected to the plurality of inputs of the pulse-to-asynchronous digital converter in a predetermined sequence. The apparatus further includes an asynchronous-digital-to-synchronous digital converter having at least a plurality of inputs and an output, the plurality of outputs of the pulse-to-asynchronous digital converter are connected to the plurality of inputs of the asynchronous-digital-to-synchronous digital converter in a predetermined sequence. Further, a signal processor has at least an input and an output, the output of the asynchronous-digital-to-synchronous digital converter is connected to the input of the signal processor, and the signal processor is configured to output an estimate of the analog signal at the output of the signal processor.

The present disclosure can also be viewed as providing a method of making a compressed sensing analog-to-digital converter. The method includes generating an analog signal having a frequency, providing a time encoder having at least an input, an output, and a pulse frequency, the analog signal frequency being higher than the pulse frequency, and the time encoder configured to generate an excitation vector including a plurality of projection values of the analog signal into a plurality of testing basis functions, and a plurality of known basis functions. The method further includes connecting the analog signal to the input of the time encoder, including a pulse domain demultiplexer, having at least an input and a plurality of outputs, and connecting the output of the time encoder to the input of the pulse domain demultiplexer. The method may further include configuring a pulse-to-asynchronous digital converter to have at least a plurality of inputs and a plurality of outputs, connecting the plurality of outputs of the pulse domain demultiplexer to the plurality of inputs of the pulse-to-asynchronous digital converter in a predetermined sequence, providing an asynchronous-digital-to-synchronous digital converter having at least a plurality of inputs and an output, which may be multichannel, connecting the plurality of outputs of the pulse-to-asynchronous digital converter to the plurality of inputs of the asynchronous-digital-to-synchronous digital converter in a predetermined sequence, and configuring a signal processor to have at least an input and an output. Additionally, the method may include connecting the output of the asynchronous-digital-to-synchronous digital converter to the input of the signal processor, and configuring the signal processor to output an estimate of the analog signal at the output of the signal processor.

Other systems, methods, features, and advantages of the present disclosure will be, or will become apparent, to a person having ordinary skill in the art upon examination of the following drawings and detailed description. It is intended that all such additional systems, methods, features, and advantages included within this description, be within the scope of the present disclosure, and be protected by the accompanying claims.

BRIEF DESCRIPTION OF THE SEVERAL VIEWS OF THE DRAWING(S)

Many aspects of the disclosure can be better understood with reference to the following drawings. Components in the drawings are not necessarily to scale, emphasis instead being placed upon clearly illustrating the principles of the present disclosure. Moreover, in the drawing, like-referenced numerals designate corresponding parts throughout the several views.

FIG. 3 depicts a block diagram of the ADC of the present disclosure.

FIG. 3a is a schematic diagram of an embodiment of the encoder 304 depicted in FIG. 3.

FIG. 3b is a schematic diagram of an embodiment of the decoder 340 depicted in FIG. 3.

FIG. 3d is a schematic diagram of an embodiment of the pulse to asynchronous digital converter 332 depicted in FIG. 3.

FIG. 3e is a schematic diagram of an embodiment of the asynchronous Analog to Digital Converter (ADC) depicted in FIG. 3d.

FIGS. 6a-6d demonstrate a comparison of errors in time domain and Fourier domain.

Figure 7:
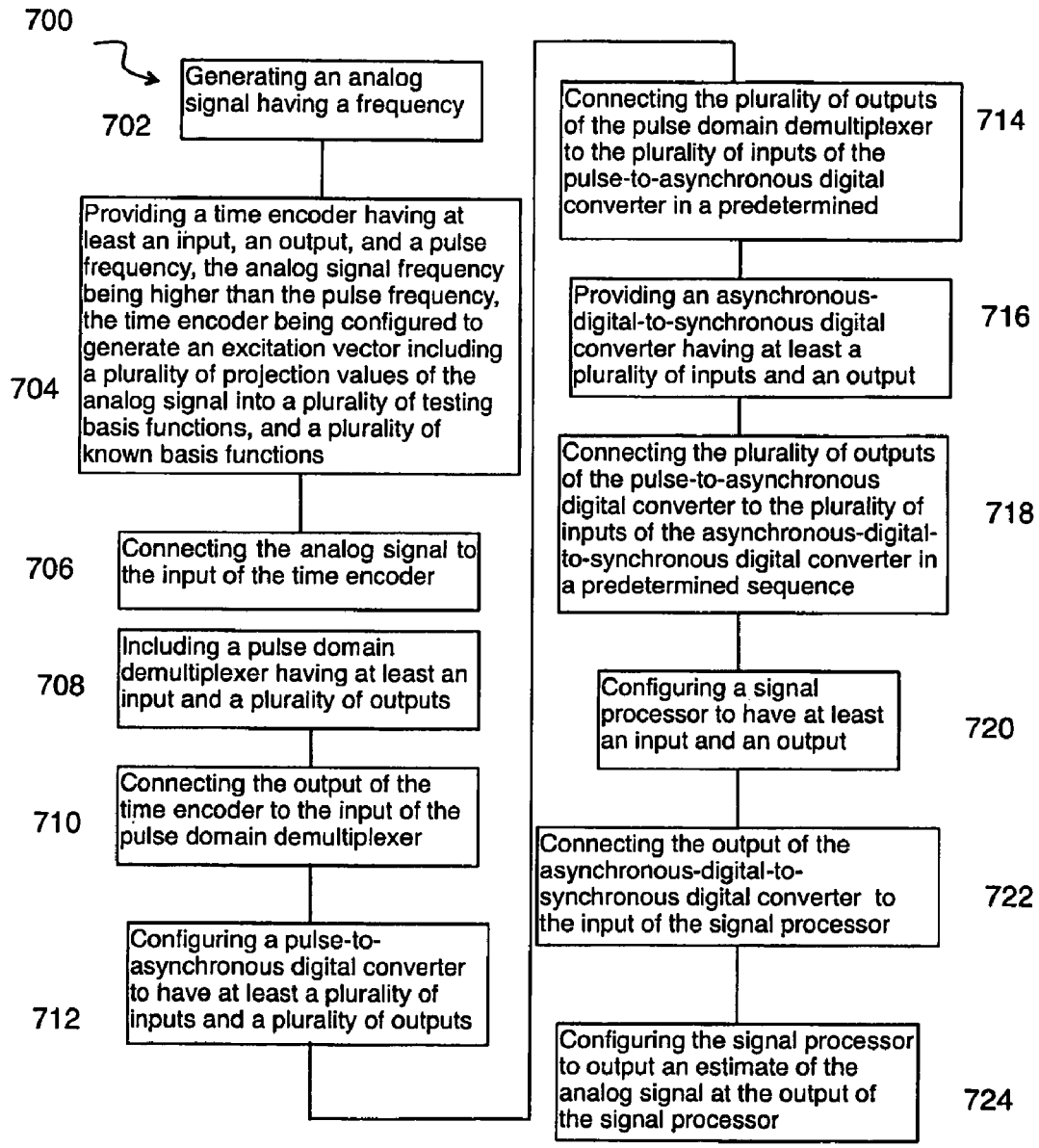

FIG. 7 shows a flowchart of a method of the present disclosure.

DETAILED DESCRIPTION

The present disclosure relates to analog-to-digital signal conversion techniques and in particular to compressed sensing analog-to-digital converter systems and methods. Specifically, the disclosed system and method may be used for analog-to-digital signal conversion where a time encoder operates at a sampling rate below a Nyquist rate determined by the bandwidth of the input signal. Typically, the disclosed system and method find application in a signal processing system.

FIG. 3 shows a block diagram of an apparatus 300 of the present disclosure for accomplishing analog-to-digital signal conversion. The apparatus 300 is a compressed sensing analog-to-digital converter. The apparatus 300 is responsive to an analog input signal x(t) having a frequency from zero hertz to some maximum frequency (which might well be determined by the Nyquist sampling rate). The apparatus 300 includes a time encoder 304 having at least an input 302, an output 303, and a pulse frequency, the frequency of the analog input signal x(t) being higher than the pulse frequency of the time encoder 304. The time encoder 304 is configured to generate an excitation vector, explained below, including a plurality of projection values of the analog signal 302 into a plurality of testing basis functions, and a plurality of known basis functions.

The analog signal x(t) is coupled to the input 302 of the time encoder 304 as mentioned above. An embodiment of the time encoder is shown in FIG. 3a. The time encoder 304 preferably has an optional gain block or an amplifier ($g_1$) 307 connected to an optional filter (h) 308. The filter 308 may be an arbitrary filter because the apparatus 300 may perform at a sampling rate below a Nyquist rate determined by the bandwidth of the input signal. The filter 308, if utilized, has an output connected to an input of an integrator 312 via a summing node 310. An output of the integrator 312 is connected to an input of a hysteresis quantizer 314. It should be noted that a hysteresis quantizer 314 is selected merely as an exemplary quantizer. Other types of quantizers may be used instead of a hysteresis quantizer. The hysteresis quantizer 314 outputs a pulse domain output signal x(t) at its output 303. A summer or summing node 310 is included between the filter 308 and the integrator 312. An amplifier 316 ($g_3$), such an a gain block, has an input coupled to the output of the hysteresis quantizer 314 and has an output connected to the summing node 310. The pulse domain output signal z(t), which is generated by the tone encoder in response to the input analog signal 302, is provided at the output 303 of the time encoder 304.

Figure 1:
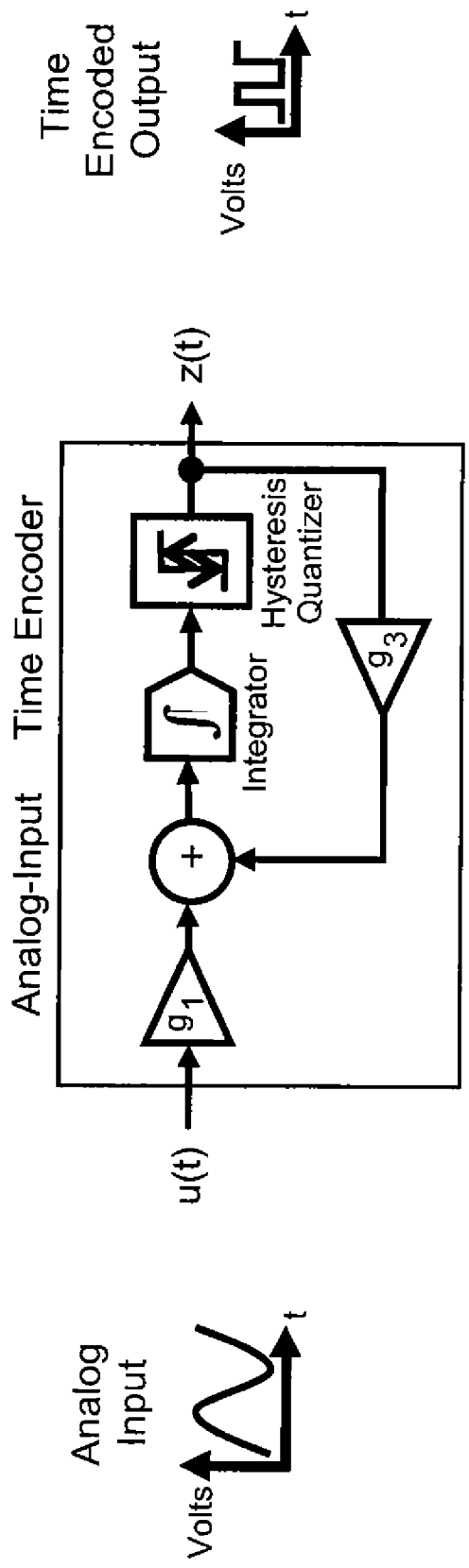
FIG. 1 is a block diagram of a prior art time encoder.
Figure 2:
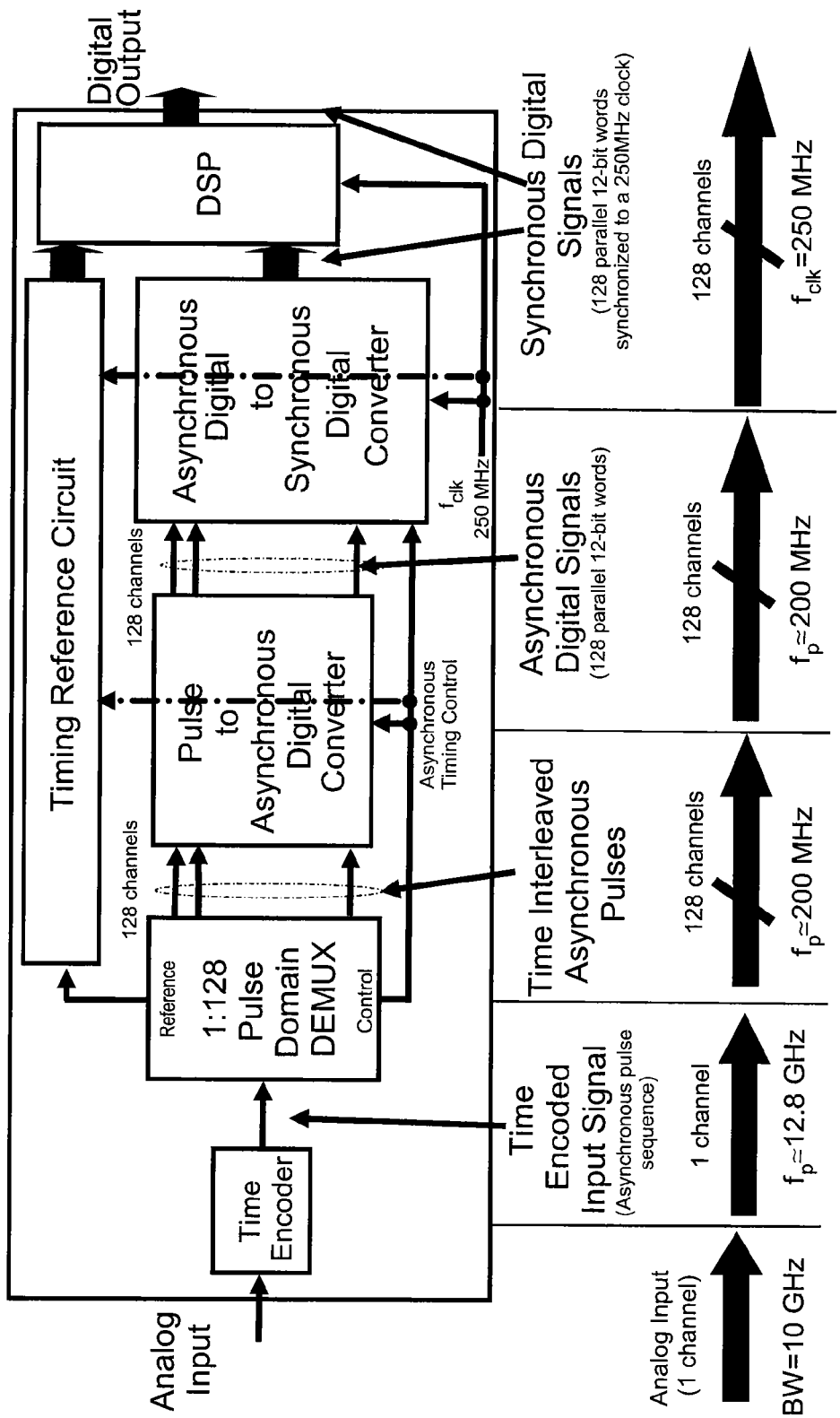
FIG. 2 illustrates a prior ADC architecture based on a time encoder having a pulse frequency higher than a frequency of an analog input which ADC architecture we previously made the subject of the patent application identified above (document [2]).
Figure 3C:
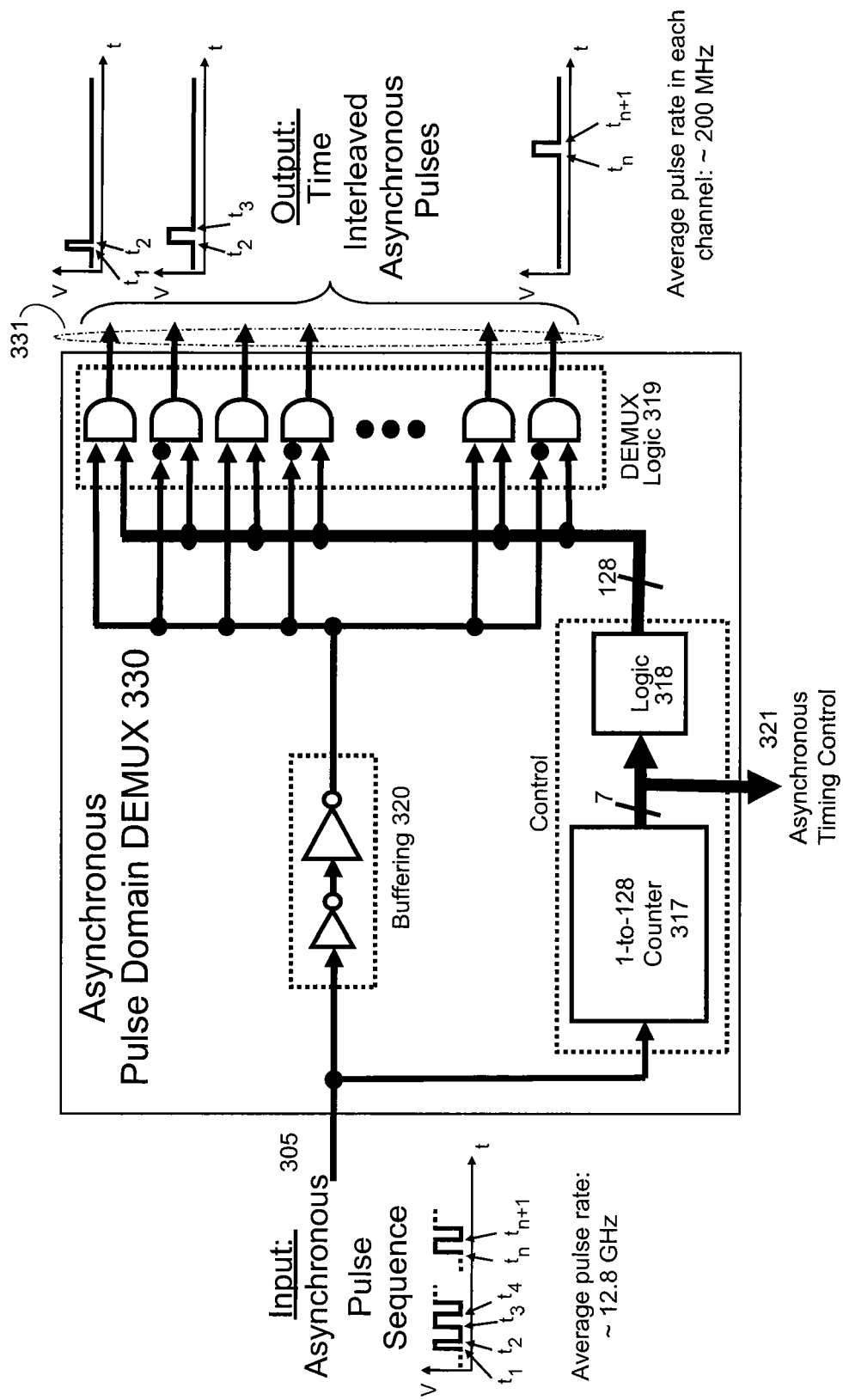
FIG. 3c is a schematic diagram of an embodiment of the asynchronous pulse domain demultiplexer 330 depicted in FIG. 3.

The apparatus 300 further includes a pulse domain demultiplexer 330, having at least an input 305 and a plurality of outputs 331. As is illustrated in FIG. 3c, the pulse domain demultiplexer 330 may be a 1:128 pulse domain demultiplexer 330 having a 128-channel output 331. The output 303 of the time encoder 304 is connected to the input 305 of the pulse domain demultiplexer 330. A 128-bit counter 317 counts on transitions in signal 305 and outputs a 7-bit number on the Asynchronous Timing Control Signal line 321, which number increments on the transitions in the input pulse train. The 7-bit output of the counter 317 is converted by logic 318 to provide an enabling signal on a single one of the 128 outputs thereof to enable a single gate in DEMUX logic 319 to pass the input signal onto one of the 128 outputs according to which pulse in the input sequence to being examined. Usually, there would be a one to one correspondence between the place which a pulse occurs in the input pulse train and the output line 331 on which it appears, but there is no particular necessity for such a one-to-one relationship occur so long as when the signals are decoded, the designer keeps straight which output 331 corresponds to which pulse in the input pulse train. Buffering elements 320 account for delay occurring in counter 317 and logic 318 so the pulse train inputted at 305 is delayed as needed when applied to the DEMUX logic 319 to account for the delay incurred in the creation of the 128 enabling signals also applied to the gates in DEMUX logic 319.

An embodiment of the pulse-to-asynchronous digital converter 332 is shown in FIG. 3d. which preferably has a plurality of inputs 321 corresponding in number to the number of outputs 321 in the pulse-to-asynchronous digital converter 332 and a plurality of outputs, for example, 128 multi-bit outputs 335 (each output has 12 bits in this embodiment, so there are a total of 128×12 individual output lines in this embodiment). The plurality of outputs 331 of the pulse domain demultiplexer 330 are connected to the plurality of inputs 331 of the pulse-to-asynchronous digital converter 332 in a predetermined sequence determined, for example, by a specific demultiplexing scheme preferred in a given application. This could be just a one-to-one correspondence, for example. The pulse-to-asynchronous digital converter 332 preferably has 128 1-bit DACs 322 having inputs coupled to receive the 128 inputs 331. The outputs of the 1-bit DAC's are coupled to an array of 128 integrator 323 each of which receives a reset control signal from logic 318' (which may be identical to logic 318 in function). The outputs of the integrator 323 are applied to an array of 128 12-bit asynchronous DACs 324. An embodiment of an individual 12-bit DAC 324 is shown by the schematic of FIG. 3e. The outputs of each ADC in FIG. 3e is a static digital value proportional to $2^n$ where n=12 in that embodiment.

Figure 3F:
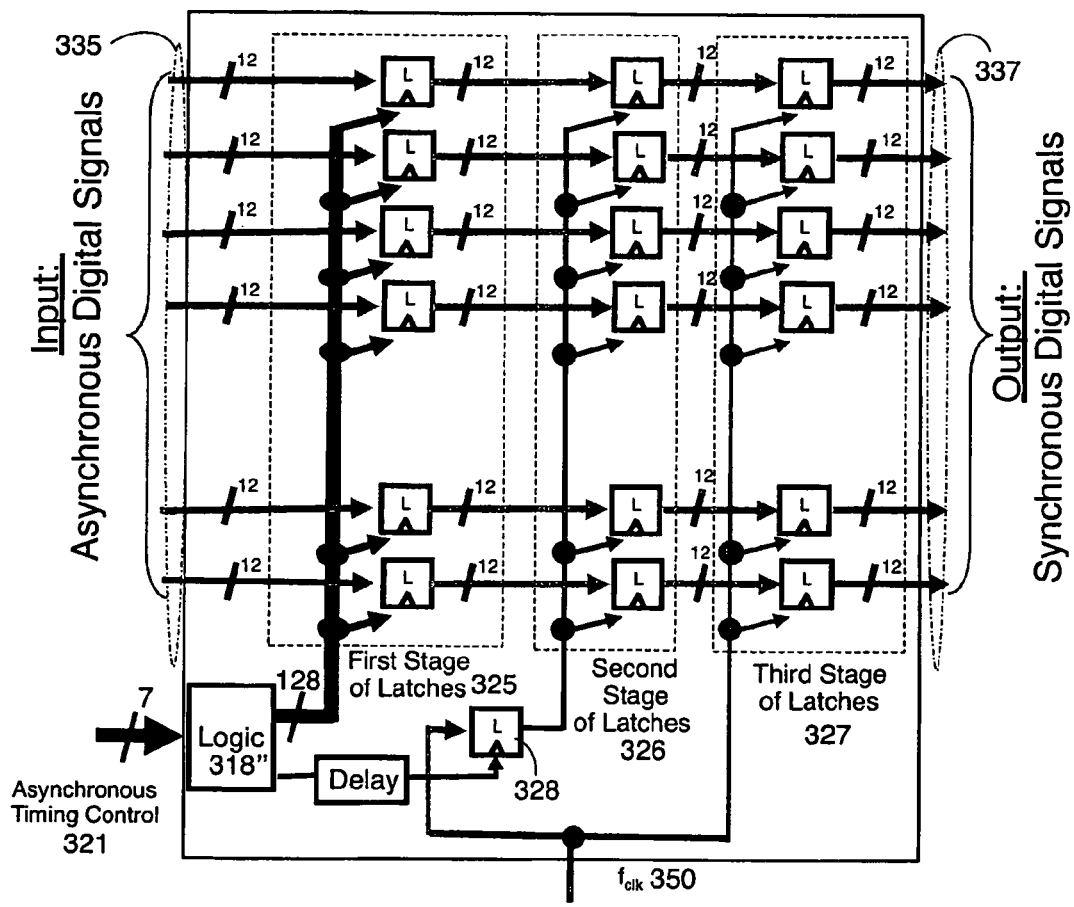
FIG. 3f is a schematic diagram of an embodiment of the pulse to asynchronous digital to synchronous digital converter 336 depicted in FIG. 3.

An asynchronous-digital-to-synchronous digital converter 336 has at least a plurality of inputs, such as 128 inputs, and an output 337. An embodiment of asynchronous-digital-to-synchronous digital converter 336 is depicted by FIG. 3f where three sets of latches 325, 326 and 327 a coupled in series and under control of logic 318" (which is similar to logic 318 and 318') in combination with a latch 328, place the 12-bit data from the pulse to asynchronous converter 332 into sync. The first stage of latches 325 captures asynchronous digital data (one lines 335) at the end of each asynchronous cycle. The second and third stages 326 and 327 of latches synchronize the digital data to the clock $f_{clk}$ 350.

The plurality of outputs 335 of the pulse-to-asynchronous digital converter 332 are connected to the plurality of inputs of the asynchronous-digital-to-synchronous digital converter 336 in a predetermined sequence determined, for example, by a specific demultiplexing scheme preferred in a given application. A signal processor 338 having at least an input and an output is also included in the apparatus 300. The signal processor 338 may be a digital signal processor (DSP). The output of the asynchronous-digital-to-synchronous digital converter 336 is connected to an input of the signal processor 338 and the signal processor 338 is configured to output an estimate y of the analog signal 302 at the output of the signal processor 338.

In the apparatus 300, an asynchronous timing control signal 321 is connected to the pulse domain demultiplexer 330, the pulse-to-asynchronous digital converter 332, and the asynchronous-digital-to-synchronous digital converter 336. Further, the apparatus 300 includes a reference clock $f_{clk}$ 350 connected to the asynchronous-digital-to-synchronous digital converter 336 and the signal processor 338.

In the apparatus 300, the signal processor 338 further comprises a minimizing element 340 for outputting the estimate a of the analog signal 302. The minimizing element 340 is adapted to substantially minimize a plurality of coefficients $(a_1, a_2, \ldots, a_N)$ such that a plurality of simultaneous linear equations including the plurality of testing basis functions $(W_i(t))$, the plurality of known basis functions $(N_y(t))$, and the plurality of coefficients $(a_1, a_2, \ldots, a_N^b)$, holds in a form Ta=y, wherein T, a, and y are matrices as illustrated in block 340 of FIG. 3b featuring an equation 342, indicating "minimize a such that Ta=y," as shown below and also described in FIG. 4a. In compression sensing, $N^b$ is usually $\gg M$.

$$\begin{vmatrix} \int_I W_1(t)N_1(t)dt & \int_I W_1(t)N_2(t)dt & \ldots & \int_I W_1(t)N_{N^b}(t)dt \\ \int_I W_2(t)N_1(t)dt & \int_I W_2(t)N_2(t)dt & \ldots & \int_I W_2(t)N_{N^b}(t)dt \\ \ldots & \ldots & \ldots & \ldots \\ \int_I W_M(t)N_1(t)dt & \int_I W_M(t)N_2(t)dt & \ldots & \int_I W_M(t)N_{N^b}(t)dt \end{vmatrix} \begin{vmatrix} a_1 \\ a_2 \\ \ldots \\ a_{N^b} \end{vmatrix} =$$

$$\begin{vmatrix} \int_I x(t)W_1(t)dt \\ \int_I x(t)W_2(t)dt \\ \ldots \\ \int_I x(t)W_M(t)dt \end{vmatrix}$$

where $$T = \begin{vmatrix} \int_I W_1(t)N_1(t)dt & \int_I W_1(t)N_2(t)dt & \ldots & \int_I W_1(t)N_{N^b}(t)dt \\ \int_I W_2(t)N_1(t)dt & \int_I W_2(t)N_2(t)dt & \ldots & \int_I W_2(t)N_{N^b}(t)dt \\ \ldots & \ldots & \ldots & \ldots \\ \int_I W_M(t)N_1(t)dt & \int_I W_M(t)N_2(t)dt & \ldots & \int_I W_M(t)N_{N^b}(t)dt \end{vmatrix},$$

$$\bar{a} = \begin{vmatrix} a_1 \\ a_2 \\ \ldots \\ a_{N^b} \end{vmatrix}, \text{ and } \bar{y} = \begin{bmatrix} \int_\Omega x(t)W_1(t)dt \\ \int_\Omega x(t)W_2(t)dt \\ \ldots \\ \int_\Omega x(t)W_M(t)dt \end{bmatrix}.$$

As can be appreciated by a person skilled in the art, the apparatus 300 could be implemented in hardware, software, firmware, a very large scale integration (VLSI) circuit or similar.

FIG. 7 is a flowchart of a method 700 of making a compressed sensing analog-to-digital converter 300. The method 700 assumes that an analog signal having a frequency (block 702) is generated which needs to be converted to a digital signal. The method includes providing a time encoder 304 having at least an input 302, an output 303, which operates at a pulse frequency, the analog signal frequency being higher than the pulse frequency, the time encoder 304 being configured to generate an excitation vector including a plurality of projection values of the analog signal into a plurality of testing basis functions, and a plurality of known basis functions (block 704), connecting the analog signal to the input of the time encoder (block 706), including a pulse domain demultiplexer 330 having at least an input and a plurality of outputs (block 708), and connecting the output of the time encoder to the input of the pulse domain demultiplexer (block 710).

The method 700 may further include configuring a pulse-to-asynchronous digital converter 332 to have at least a plurality of inputs and a plurality of outputs (block 712), connecting the plurality of outputs 331 of the pulse domain demultiplexer 330 to the plurality of inputs of the pulse-to-asynchronous digital converter 332 in a predetermined sequence (block 714), providing an asynchronous-digital-to-synchronous digital converter 336 having at least a plurality of inputs and an output 337 (block 716), and connecting the plurality of outputs of the pulse-to-asynchronous digital converter to the plurality of inputs of the asynchronous-digital-to-synchronous digital converter in a predetermined sequence (block 718). Additionally, the method 700 may include configuring a signal processor 340 to have at least an input and an output (block 720), connecting the output of the asynchronous-digital-to-synchronous digital converter to the input of the signal processor (block 722), and configuring the signal processor to output an estimate of the analog signal at the output of the signal processor (block 724).

In the method 700, the providing the time encoder may further include filtering the analog signal, and the filtering may further include integrating. In the method 700, the providing the time encoder further includes one of quantizing and integrating. Such quantizing may optionally be a hysteresis-based quantizing.

In the method 700, the providing the time encoder may also be including a filter, an integrator, and one of a quantizer and a hysteresis quantizer, connecting the output of the filter to the input of the integrator and connecting the output of the integrator to one of the input of the quantizer and the input of the hysteresis quantizer.

The method 700 may further include connecting an amplifier between one of the output of the quantizer and the output of the hysteresis quantizer and the input of the integrator. Such connecting of an amplifier is comparable to connecting a gain block in a feedback path, for example. The configuring the signal processor may include a minimizing element for outputting the estimate of the analog signal, wherein the minimizing element is adapted to substantially minimize a plurality of coefficients $(a_1, a_2, \ldots, a_N)$ such that a plurality of simultaneous linear equations that include the plurality of testing basis functions, the plurality of known basis functions, and the plurality of coefficients, holds in a form Ta=y, wherein T, a and y are matrices as illustrated in FIG. 3b featuring an equation 342, indicating "minimize a such that Ta=y," and described in FIG. 4:

$$\begin{vmatrix} |\int W_1(t)N_1(t)dt & |\int W_1(t)N_2(t)dt & \ldots & |\int W_1(t)N_{N^b}(t)dt \\ |\int W_2(t)N_1(t)dt & |\int W_2(t)N_2(t)dt & \ldots & |\int W_2(t)N_{N^b}(t)dt \\ \ldots & \ldots & \ldots & \ldots \\ |\int W_M(t)N_1(t)dt & |\int W_M(t)N_2(t)dt & \ldots & |\int W_M(t)N_{N^b}(t)dt \end{vmatrix} \begin{vmatrix} a_1 \\ a_2 \\ \ldots \\ a_{N^b} \end{vmatrix} = \begin{vmatrix} |\int x(t)W_1(t)dt \\ |\int x(t)W_2(t)dt \\ \ldots \\ |\int x(t)W_M(t)dt \end{vmatrix}$$

where $$\overline{T} = \begin{vmatrix} |\int W_1(t)N_1(t)dt & |\int W_1(t)N_2(t)dt & \ldots & |\int W_1(t)N_{N^b}(t)dt \\ |\int W_2(t)N_1(t)dt & |\int W_2(t)N_2(t)dt & \ldots & |\int W_2(t)N_{N^b}(t)dt \\ \ldots & \ldots & \ldots & \ldots \\ |\int W_M(t)N_1(t)dt & |\int W_M(t)N_2(t)dt & \ldots & |\int W_M(t)N_{N^b}(t)dt \end{vmatrix},$$

$$\overline{a} = \begin{vmatrix} a_1 \\ a_2 \\ \ldots \\ a_{N^b} \end{vmatrix}, \text{ and } \overline{y} = \begin{vmatrix} \int_\Omega x(t)W_1(t)dt \\ \int_\Omega x(t)W_2(t)dt \\ \ldots \\ \int_\Omega x(t)W_M(t)dt \end{vmatrix}.$$

The method 700 may also include connecting an asynchronous timing control signal to the pulse domain demultiplexer, the pulse-to-asynchronous digital converter, and the asynchronous-digital-to-synchronous digital converter; as well as connecting a reference clock to the asynchronous-digital-to-synchronous digital converter and the signal processor.

The foregoing method 700 or elements of the method 700 may also be stored on a computer-readable medium having computer-executable instructions to implement the method 700 or the elements of the method 700.

FIG. 3 shows a block diagram compressed sensing Analog to Digital Converter of the present invention. The key components that enable compressed sensing are the front-end time encoder block and the final decoder.

FIG. 3a shows the time encoder 304. This block consists of a time encoder with an internal filter. The input to this block is the analog signal x(t). The output to this block is a pulse time encoded signal z(t). The pulse rate of the output pulse signal z(t) can be lower than the highest frequency component of the analog signal X(t).

FIG. 3b shows the decoder 340. The decoder is preferably implemented as a DSP. The decoder 340 implements an optimization algorithm that consists of minimizing the norm-1 of a vector a (of size $N^b$) subject to the equality constraints given by the following system of equations T·a=y. The matrix T is a matrix of size $M \times N^b$. The vector a (of size $N^b$) contains a set of $N^b$ coefficients that describe the input analog signal in a basis (for example a sine/cosine basis).

FIGS. 3c-3f shown possible circuits for implementing certain of block shown in the block diagram, as already discussed.

Figure 4A:
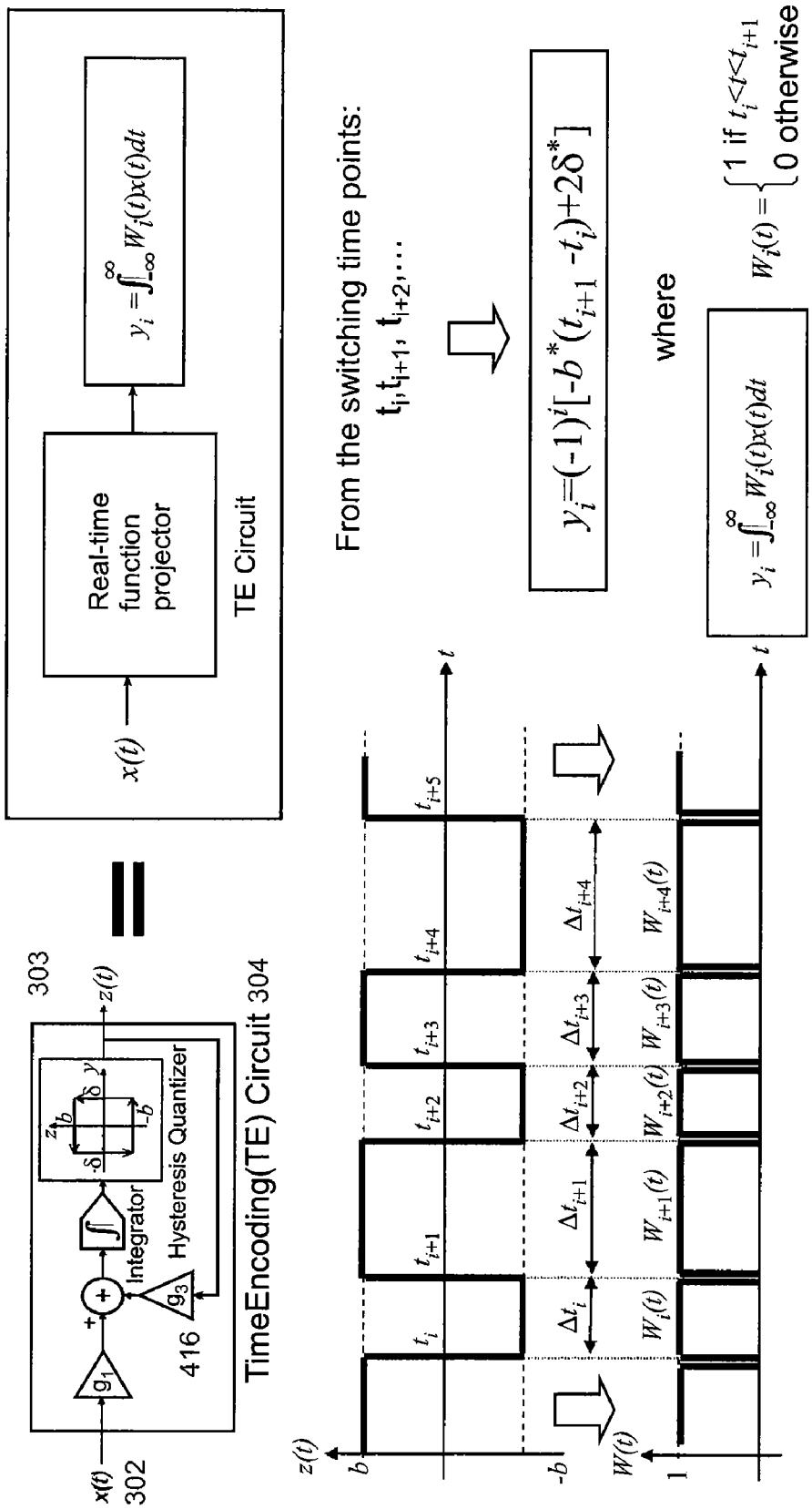
FIGS. 4a and 4b show an algorithm according to the present disclosure.
Figure 4B:

FIG. 4a summarizes the signal recovery concept and algorithm which is based on the theories of function projection, Compressed Sensing (CS), and Time Encoding (TE). Based upon the inventor' knowledge, the connection disclosed herein between CS and TE was previously unknown in the prior art. The connection between the CS and TE is established by first establishing the connection between the TE and function projection—particularly, between the TE and Weighted Residual Approximation (WRA) of functions—and then establishing the connection between the CS and WRA.

FIG. 4a shows the mathematical model of the time encoder or TE circuit 304. The basic time encoding equation, which expresses the relationship between two consecutive switching time points, and the integral value of the input function between these two switching time points, is also shown in the figure.

The right top portion of FIG. 4a shows a functional model of the TE circuit 304. The filter has been omitted from this embodiment. One can consider the TE circuit 304 as a "real-time function projector", where the projection functions are the non-uniform and unit amplitude pulse functions $W_i(t)$ defined by the switching time points. The projection values—the integral values of the product of the input function and basis functions—can be calculated from the values of two consecutive switching time points via the time encoding equation shown in below the functional model of FIG. 4a. It is important to note that only the values of the switching time points carry information. However, these time points carry two independent sets of information, 1) the widths and locations of the pulse basis functions, and 2) the value of the projection, i.e., the integral values of the product of the input function and basis functions.

Using these TE models one can establish the connection between the TE and WRA. First let's summarize the basic concept of the WRA.

The WRA is a well-known and well-documented function approximation technique that is widely used in commercially available finite element-based and method of moments-based CAD simulation tools and packages. The goal of the WRA is to approximate a function x(t) with a linear combination of known basis functions $N_j(t)$. The coefficients $a_j$ are unknowns and are found by the WRA process. The approximation starts with the definition of an error signal and a weighted residual statement that forces the condition that the weighted integral values of the error signal are equal to zero. The "weighting" is achieved via the testing functions $W_i(t)$. The end result of the WRA process is a simultaneous linear system of equations for the unknown coefficients $a_j$. The explicit form of this linear system of equations is shown in the FIG. 4b. The matrix elements $T_{ij}$ are the integral values of the products of the testing and basis functions. The excitation vector y consists of the projection values of the function x(t) into the testing function base $W_i(t)$. It is important to note that in the general WRA scheme the number of basis functions and number of testing functions can be different (i.e., $N^b < >M$).

Utilizing the time encoding equation shown in FIG. 4a one can establish the connection between TE and WRA. One can state that the TE circuit 302 projects the input signal x(t) into the testing function base $W_i(t)$, where the testing functions are the unit amplitude pulse functions defined by two consecutive switching time points shown in the figure. In the content of the TE process we call this testing function base the "capture base" since the input signal is captured in this base. Following the general WRA procedure one can reconstruct the input signal x(t) in the "reconstruction base" by solving the linear system of equations for the unknown coefficients $a_j$.

For a bandlimited signal the reconstruction base is typically the sine base. The end result of the WRA procedure is the coefficients of the sine functions $a_j$; representing the input signal x(t) that was captured via the capture base $W_i(t)$. This result establishes the connection between the TE and WRA.

The connection between TE and CS can now be established by combining the connection between the TE and WRA and CS and WRA. In summary, the TE circuit 302 performs the "measurements" and provides the projection coefficients where the projection (capture) basis functions are the unit amplitude pulse functions and defined by the switching time points. The transform matrix from the capture base to the sparsity (reconstruction) base is defined by the switching time points and the reconstruction basis functions. The only free parameters in this entire process is the capture basis functions $W_i(t)$. Fortunately, these capture basis functions can be chosen almost arbitrarily via a simple filtering operation since $W_i(t)$ is the integer shifted and time-reversed impulse response of the pre-filter h 308 shown in FIG. 3. If the filter is adaptive, one always can ensure weak mutual coherence between the capture and reconstruction bases needed for high dynamic range signal reconstruction. Fortunately, with this pulse domain filtering concept one easily can reconfigure the filter transfer function of the pre-filter h via digital control by using a suitable digitally controllable analog filter. A tunable pulse domain filter is described in detail in U.S. Pat. No. 7,403,144.

The description of FIG. 4a shows the simplified case in which the filter h 308 of FIG. 3 has a transfer function in the frequency domain equal to I (all-pass with unity gain so the filter is effectively omitted). In that simplified case the matrix T is given by:

$$\bar{T} = \begin{vmatrix} \int_l W_1(t)N_1(t)dt & \int_l W_1(t)N_2(t)dt & \ldots & \int_l W_1(t)N_{N^b}(t)dt \\ \int_l W_2(t)N_1(t)dt & \int_l W_2(t)N_2(t)dt & \ldots & \int_l W_2(t)N_{N^b}(t)dt \\ \ldots & \ldots & \ldots & \ldots \\ \int_l W_M(t)N_1(t)dt & \int_l W_M(t)N_2(t)dt & \ldots & \int_l W_M(t)N_{N^b}(t)dt \end{vmatrix}$$

In the most general case, where the filter h 308 has an arbitrary transfer function F(.) the recovery is identical except that the T matrix is given by:

$$\bar{T} = \begin{vmatrix} \int_l W_1(t)F(N_1(t))dt & \int_l W_1(t)F(N_2(t))dt & \ldots & \int_l W_1(t)F(N_{N^b}(t))dt \\ \int_l W_2(t)F(N_1(t))dt & \int_l W_2(t)F(N_2(t))dt & \ldots & \int_l W_2(t)F(N_{N^b}(t))dt \\ \ldots & \ldots & \ldots & \ldots \\ \int_l W_M(t)F(N_1(t))dt & \int_l W_M(t)F(N_2(t))dt & \ldots & \int_l W_M(t)F(N_{N^b}(t))dt \end{vmatrix}$$

Figure 5A:
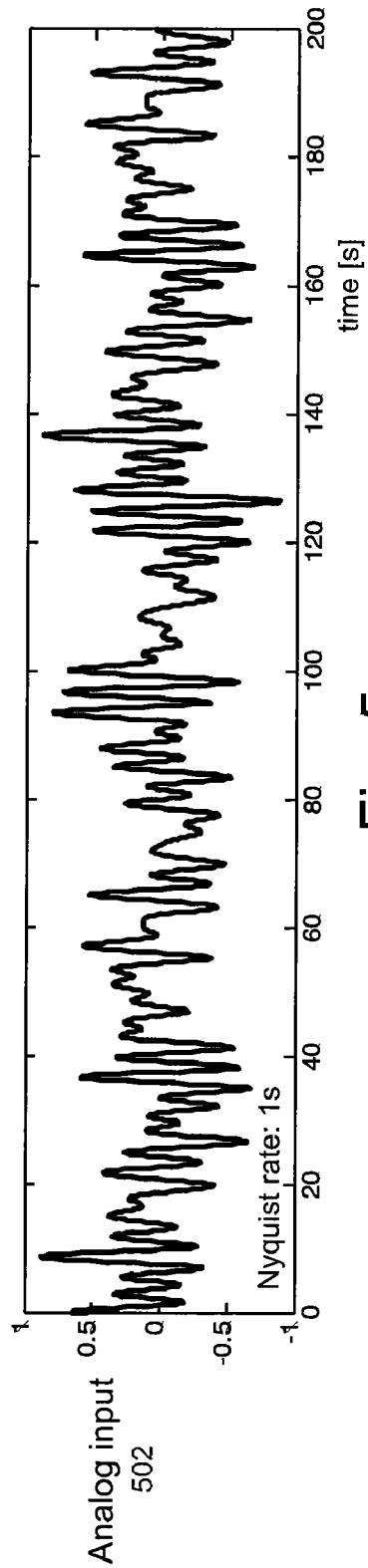
FIGS. 5a and 5b show time domain waveforms of the ADC of the present disclosure.
Figure 5B:
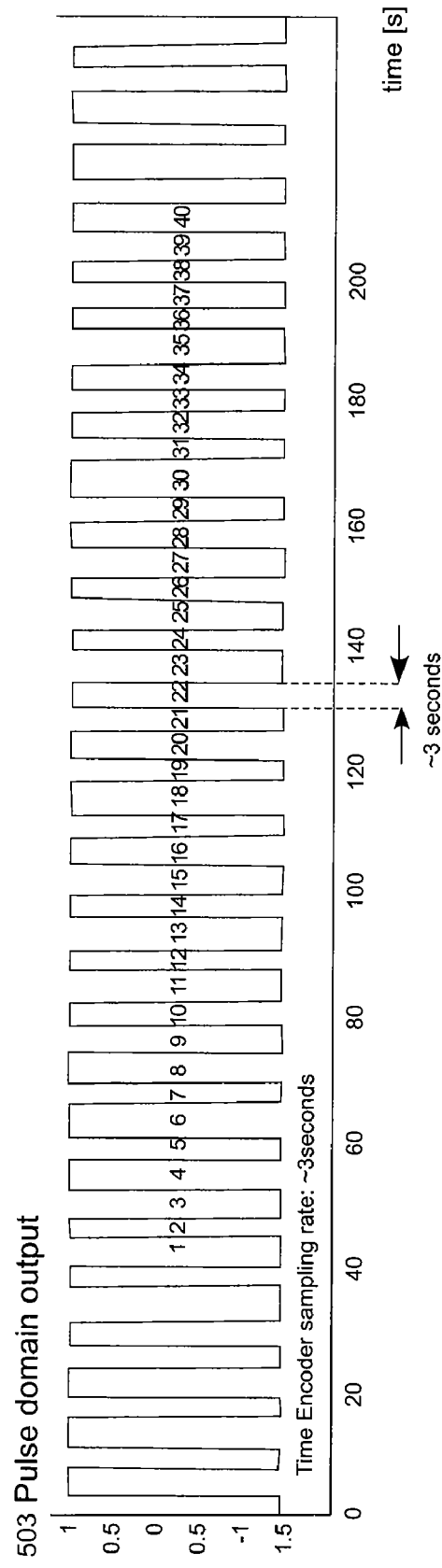

FIGS. 5a and 5b show time domain waveforms of the circuit of the present disclosure. The waveform of FIG. 5a shows the input analog signal. In this example is a 10-tone signal. For the frequencies used in this example the minimum sampling rate (Nyquist sampling) is 1 sample per second.

The waveform of FIG. 5b shows the pulse rate of the time encoder. Observe that the average interval between two edges of the pulses is about 3 seconds. The circuit has an undersampling ratio of 3 (which would be impossible to recover input using the ADCs known in the prior art). However, the new circuit of the this disclosure is able to recover the input signal, as long the signal is sparse in any basis.

FIG. 3 shows the Compressed Sensing ADC (Analog to Digital Converter) of the present disclosure. The upper graph of FIG. 5 shows an exemplary analog input signal. while the bottom graph of FIG. 5 shows the signal at the output of the front-end time encoder 302.

In this example the analog input signal (middle graph of FIG. 5) has a bandwidth of 0.5 Hz. The Nyquist frequency, $f_{Nyquist}$, is 1 Hz. The original analog signal could be perfectly recovered from sampled data, using conventional existing Nyquist recovery methods (such as a sine interpolation), if the samples are taken at a rate of at least 1 sample per second.

The input signal of the example is not an arbitrary signal, but is a signal sparse in the sine/cosine basis. The input signal is a signal sparse in a sine/cosine basis of size $N^b=128$ (the basis functions $N_j(t)$ are sines and cosines, with frequencies from 0 Hz to ½ Hz in $1/128$ Hz intervals, while $N^b$ refers to the number of basis functions $N_j(t)$). The sparsity is k=10 (only 10 of the 'a' coefficients are non-zero, but you do not know which ones of the 'a' coefficients are non-zero). Using compressed sensing theory (see prior art reference [3]) all 128 coefficients can be recovered from only M samples, where M should satisfy the following (approximate) equation:

$$M > 2*k*\log_2(N^b/M)$$

In our case $N^b=128$ and k=10, and thus M equals 40. The 128 coefficient representing the signal can be recovered from only 40 compressed sensing samples. The input signal can be recovered from compress sensing samples taken at a rate of $(M/N_b) \cdot f_{Nyquist}$, or about 1 sample per 3 seconds (lower than the Nyquist rate).

In the disclosed circuit each sample is defined as the time interval between two consecutive edges (either rising or falling) of the pulse signal (see FIG. 5b). To recover all 128 coefficients of the input signal 502 (see FIG. 5a) it is only necessary to use 40 time intervals between consecutive edges (either rising or falling) of the pulse signal (FIG. 5a).

The recovery is done by the DSP 340. In this example the recovery (using the algorithm described in FIGS. 4a and 4b) generates an internal 40×128 data matrix T describing 40 constraint equations (one for each of the 40 compressed measurements) and applies a minimization of the norm-1 of a vector a of size 128. The final outputs are the 128 coefficients of the input signal in a sine/cosine basis.

FIG. 6c shows the final output produced by the circuit of the invention in the time domain (and compares it to the input signal) whereas FIG. 6a shows the same thing in the Fourier domain. Assuming ideal elements, the 10 tone input signal is recovered almost perfectly (better than $10^{-8}$ resolution) both in the frequency domain (see FIG. 6b) and in the time domain (see FIG. 6d). This is the first circuit to be able to encode and recover signals that have been time encoded at a rate below the Nyquist rate.

The two graphs of FIGS. 6a and 6b show the signals in a Sine/Cosine basis (sparsity basis). FIG. 6a is a plot that shows the 128 coefficients of the original analog signal and the recovered signal (signal obtained after time encoding the signal with a Sub Nyquist time encoder 302 front end and doing a decoding). In FIG. 6a is should be noted that most of the values of 'a' are equal to zero while ten values of 'a' are non-zero. Both sets are virtually identical (indistinguishable in the plot). The plot of FIG. 6b shows the error (difference between the original input and the decoded signal). The error in each coefficient is in the order of $10^{-7}$ (Machine precision). This shows that there is no loss of information in the encoding and decoding process.

FIGS. 6c and 6d show the signals in the time domain. The plot of FIG. 6c shows both the original analog signal and the recovered signal. Both are virtually identical (indistinguishable in the plot). The bottom-right plot shows the error (difference between the amplitude of original input and the recovered signal). The error in the amplitude is in the order of $10^{-7}$ (Machine precision). This shows that there is no significant loss of information in the encoding and decoding process.

In the normalized example shown here the time encoder is operating at an average pulse rate of ~⅙ Hz (this corresponds to average of ~6 seconds for a full pulse, or an average time of ~3 seconds for the interval between two consecutive edges) and encodes signals up to a frequency 3 times higher than the pulse rate, or about of ½ Hz.

In an actual IC implementation of the front end time encoder, in a state of the art integrated circuit technology (InP HBT IC technology), the average pulse rate is ~30 GHz. The maximum frequency of the encoded signals can be typically 3 times higher than the pulse frequency, or about 90 GHz.

As a person having ordinary skill in the art would appreciate, the elements or blocks of the methods described above could take place at the same time or in an order different from the described order.

It should be emphasized that the above-described embodiments are merely some possible examples of implementation, set forth for a clear understanding of the principles of the disclosure. Many variations and modifications may be made to the above-described embodiments of the invention without departing substantially from the principles of the invention. All such modifications and variations are intended to be included herein within the scope of this disclosure and the present invention and protected by the following claims.

What is claimed is:

1. An analog-to-digital converter apparatus, the apparatus sensing an analog signal having a frequency, the apparatus comprising:

a time encoder having at least an input, an output, and a pulse frequency, the analog signal frequency of the analog signal to be sensed being higher than the pulse frequency of the time encoder, the time encoder being configured to generate an excitation vector including a plurality of projection values of the analog signal into a plurality of testing basis functions; the analog signal being connected to the input of the time encoder;

a pulse domain demultiplexer having at least an input and a plurality of outputs; the output of the time encoder being connected to the input of the pulse domain demultiplexer;

a pulse-to-asynchronous digital converter having at least a plurality of inputs and a plurality of outputs, the plurality of outputs of the pulse domain demultiplexer being connected to the plurality of inputs of the pulse-to-asynchronous digital converter in a first predetermined sequence;

an asynchronous-digital-to-synchronous digital converter having at least a plurality of inputs and an output, the plurality of outputs of the pulse-to-asynchronous digital converter being connected to the plurality of inputs of the asynchronous-digital-to-synchronous digital converter in a second predetermined sequence; and a signal processor having at least an input and an output, the output of the asynchronous-digital-to-synchronous digital converter being connected to the input of the signal processor, the signal processor processing a plurality of known basis functions, wherein the signal processor being configured to output an estimate of the analog signal at the output of the signal processor.

2. The apparatus of claim 1, wherein the time encoder includes a filter having an input and an output, the input being connected to receive the analog signal, a band pass of the filter being selected to ensure minimum mutual coherence between reconstruction and capture bases.

3. The apparatus of claim 1, wherein the signal processor is a digital signal processor.

4. The apparatus of claim 1, wherein the pulse domain demultiplexer generates, in use, an asynchronous timing control signal which is applied to both the pulse-to-asynchronous digital converter and the asynchronous-digital-to-synchronous digital converter.

5. The apparatus of claim 4, further comprising a reference clock signal line connected to the asynchronous-digital-to-synchronous digital converter and the signal processor.

6. The apparatus of claim 1, wherein the signal processor includes a minimizing functionality for outputting the estimate of the analog signal, the minimizing element being adapted to substantially minimize a plurality of coefficients such that a plurality of simultaneous linear equations, the plurality of simultaneous linear equations including the plurality of testing basis functions, the plurality of known basis functions, and the plurality of coefficients, holds in a form T $\bar{a}=\bar{y}$:

$$\begin{vmatrix} |_1 W_1(t)N_1(t)dt & |_1 W_1(t)N_2(t)dt & \ldots & |_1 W_1(t)N_{N^b}(t)dt \\ |_1 W_2(t)N_1(t)dt & |_1 W_2(t)N_2(t)dt & \ldots & |_1 W_2(t)N_{N^b}(t)dt \\ \ldots & \ldots & \ldots & \ldots \\ |_1 W_M(t)N_1(t)dt & |_1 W_M(t)N_2(t)dt & \ldots & |_1 W_M(t)N_{N^b}(t)dt \end{vmatrix} \begin{vmatrix} a_1 \\ a_2 \\ \ldots \\ a_{N^b} \end{vmatrix} =$$

$$\begin{vmatrix} |_1 x(t)W_1(t)dt \\ |_1 x(t)W_2(t)dt \\ \ldots \\ |_1 x(t)W_M(t)dt \end{vmatrix}$$

where $$\overline{T} = \begin{vmatrix} |_1 W_1(t)N_1(t)dt & |_1 W_1(t)N_2(t)dt & \ldots & |_1 W_1(t)N_{N^b}(t)dt \\ |_1 W_2(t)N_1(t)dt & |_1 W_2(t)N_2(t)dt & \ldots & |_1 W_2(t)N_{N^b}(t)dt \\ \ldots & \ldots & \ldots & \ldots \\ |_1 W_M(t)N_1(t)dt & |_1 W_M(t)N_2(t)dt & \ldots & |_1 W_M(t)N_{N^b}(t)dt \end{vmatrix},$$

$$\overline{a} = \begin{vmatrix} a_1 \\ a_2 \\ \ldots \\ a_{N^b} \end{vmatrix}, \text{ and } \overline{y} = \begin{bmatrix} \int_\Omega x(t)W_1(t)dt \\ \int_\Omega x(t)W_2(t)dt \\ \ldots \\ \int_\Omega x(t)W_M(t)dt \end{bmatrix}.$$

7. A method for sensing an analog signal having a frequency in a analog-to-digital converter, the method comprising:
providing a time encoder having at least an input, an output, and operating at a pulse frequency, the frequency of the analog signal being higher than the pulse frequency, the time encoder being configured to generate an excitation vector including a plurality of projection values of the analog signal into a plurality of testing basis functions, and a plurality of known basis functions;
connecting the analog signal to the input of the time encoder;
including a pulse domain demultiplexer having at least an input and a plurality of outputs; connecting the output of the time encoder to the input of the pulse domain demultiplexer; configuring a pulse-to-asynchronous digital converter to have at least a plurality of inputs and a plurality of outputs;
connecting the plurality of outputs of the pulse domain demultiplexer to the plurality of inputs of the pulse-to-asynchronous digital converter in a predetermined sequence;
providing an asynchronous-digital-to-synchronous digital converter having at least a plurality of inputs and an output;
connecting the plurality of outputs of the pulse-to-asynchronous digital converter to the plurality of inputs of the asynchronous-digital-to-synchronous digital converter in a predetermined sequence;
configuring a signal processor to have at least an input and an output; connecting the output of the asynchronous-digital-to-synchronous digital converter to the input of the signal processor; and
configuring the signal processor to output an estimate of the analog signal at the output of the signal processor.

8. The method of claim 7, wherein the time encoder provides for filtering the analog signal using a filter having a bandpass selected to ensure minimum mutual coherence between reconstruction and capture bases.

9. The method of claim 7, wherein the signal processor is a digital signal processor.

10. The method of claim 7, wherein the pulse domain demultiplexer generates, in use, an asynchronous timing control signal which is applied to both the pulse-to-asynchronous digital converter and the asynchronous-digital-to-synchronous digital converter.

11. The method of claim 10, further comprising providing a reference clock signal to both the asynchronous-digital-to-synchronous digital converter and the signal processor.

12. The method of claim 7, wherein the configuring the signal processor further comprises configuring a minimizing element for outputting the estimate of the analog signal, the minimizing element adapted to substantially minimize a plurality of coefficients such that a plurality of simultaneous linear equations, the plurality of simultaneous linear equations including the plurality of testing basis functions, the plurality of known basis functions, and the plurality of coefficients, holds in a form $\overline{T}\overline{a}=\overline{y}$:

$$\begin{vmatrix} |_1 W_1(t)N_1(t)dt & |_1 W_1(t)N_2(t)dt & \ldots & |_1 W_1(t)N_{N^b}(t)dt \\ |_1 W_2(t)N_1(t)dt & |_1 W_2(t)N_2(t)dt & \ldots & |_1 W_2(t)N_{N^b}(t)dt \\ \ldots & \ldots & \ldots & \ldots \\ |_1 W_M(t)N_1(t)dt & |_1 W_M(t)N_2(t)dt & \ldots & |_1 W_M(t)N_{N^b}(t)dt \end{vmatrix} \begin{vmatrix} a_1 \\ a_2 \\ \ldots \\ a_{N^b} \end{vmatrix} =$$

$$\begin{vmatrix} |_1 x(t)W_1(t)dt \\ |_1 x(t)W_2(t)dt \\ \ldots \\ |_1 x(t)W_M(t)dt \end{vmatrix}$$

where $$\overline{T} = \begin{vmatrix} |_1 W_1(t)N_1(t)dt & |_1 W_1(t)N_2(t)dt & \ldots & |_1 W_1(t)N_{N^b}(t)dt \\ |_1 W_2(t)N_1(t)dt & |_1 W_2(t)N_2(t)dt & \ldots & |_1 W_2(t)N_{N^b}(t)dt \\ \ldots & \ldots & \ldots & \ldots \\ |_1 W_M(t)N_1(t)dt & |_1 W_M(t)N_2(t)dt & \ldots & |_1 W_M(t)N_{N^b}(t)dt \end{vmatrix},$$

$$\overline{a} = \begin{vmatrix} a_1 \\ a_2 \\ \ldots \\ a_{N^b} \end{vmatrix}, \text{ and } \overline{y} = \begin{bmatrix} \int_\Omega x(t)W_1(t)dt \\ \int_\Omega x(t)W_2(t)dt \\ \ldots \\ \int_\Omega x(t)W_M(t)dt \end{bmatrix}.$$

13. An analog-to-digital converter apparatus, the apparatus converting an analog signal, having a given Nyquist frequency, into the digital domain, the apparatus including a time encoder having a pulse sampling frequency less that the given Nyquist frequency of the analog signal, the time encoder outputting a pulse-encoded representation of the analog signal and means for converting the a pulse-encoded representation of the analog signal into a digital signal with an analog-to-digital conversion error of less than on part in a million in both time domain and frequency domain.

14. The analog-to-digital converter apparatus of claim 13 wherein the means for converting the a pulse-encoded representation of the analog signal into a digital signal comprises:
a pulse domain demultiplexer having at least an input and a plurality of outputs, the output of the time encoder being connected to the input of the pulse domain demultiplexer;
a pulse-to-asynchronous digital converter having at least a plurality of inputs and a plurality of outputs, the plurality of outputs of the pulse domain demultiplexer being connected to the plurality of inputs of the pulse-to-asynchronous digital converter in a first predetermined sequence;

an asynchronous-digital-to-synchronous digital converter having at least a plurality of inputs and an output, the plurality of outputs of the pulse-to-asynchronous digital converter being connected to the plurality of inputs of the asynchronous-digital-to-synchronous digital converter in a second predetermined sequence; and a signal processor having at least an input and an output, the output of the asynchronous-digital-to-synchronous digital converter being connected to the input of the signal processor, the signal processor processing a plurality of known basis functions, wherein the signal processor outputs, in use, said digital signal.

15. The analog-to-digital converter apparatus of claim 14, wherein the time encoder includes a filter having an input and an output, the input being connected to receive the analog signal, a band pass of the filter being selected to ensure minimum mutual coherence between reconstruction and capture bases.

16. The analog-to-digital converter apparatus of claim 14, wherein the signal processor is a digital signal processor.

17. The analog-to-digital converter apparatus of claim 14, wherein the pulse domain demultiplexer generates, in use, an asynchronous timing control signal which is applied to both the pulse-to-asynchronous digital converter and the asynchronous-digital-to-synchronous digital converter.

18. The analog-to-digital converter apparatus of claim 17, further comprising a reference clock signal line connected to the asynchronous-digital-to-synchronous digital converter and the signal processor.

* * * * *